US006578438B2

(12) United States Patent
Steinberg et al.

(10) Patent No.: US 6,578,438 B2
(45) Date of Patent: Jun. 17, 2003

(54) TAUT WIRE SENSOR

(75) Inventors: Emanuel Steinberg, Tel Aviv (IL); Haim Perry, Emerson, NJ (US)

(73) Assignee: Integrated Detection Systems (IL)

( * ) Notice: Subject to any disclaimer, the term of this patent is extended or adjusted under 35 U.S.C. 154(b) by 0 days.

(21) Appl. No.: 09/932,429

(22) Filed: Aug. 17, 2001

(65) Prior Publication Data

US 2003/0094051 A1 May 22, 2003

(51) Int. Cl.[7] .............................. G01L 5/00; H10H 3/02
(52) U.S. Cl. ................................ 73/862.381; 200/61.93
(58) Field of Search .......................... 73/828, 862, 381, 73/393, 392; 340/541; 200/61.93

(56) References Cited

U.S. PATENT DOCUMENTS

| | | | | |
|---|---|---|---|---|
| 3,634,638 A | * | 1/1972 | Even-Tov et al. | 200/61.93 |
| 3,867,599 A | * | 2/1975 | Moen | 200/16 A |
| 3,912,893 A | * | 10/1975 | Stoler | 200/288 |
| 4,327,593 A | | 5/1982 | Porat | |
| 4,367,459 A | | 1/1983 | Amir et al. | |
| 4,500,864 A | | 2/1985 | Nakane et al. | |
| 4,533,906 A | | 8/1985 | Amir | |
| 4,643,400 A | | 2/1987 | Porat | |
| 4,680,573 A | | 7/1987 | Ciordinik et al. | |
| 4,683,356 A | * | 7/1987 | Stoler | 200/61.93 |
| 4,730,809 A | | 3/1988 | Stoler | |
| 4,803,468 A | | 2/1989 | Seifert | |
| 4,829,287 A | | 5/1989 | Kerr et al. | |
| 4,929,926 A | | 5/1990 | Porat | |
| 5,103,207 A | | 4/1992 | Kerr et al. | |
| 5,371,488 A | | 12/1994 | Couch et al. | |
| 5,438,316 A | | 8/1995 | Motsinger et al. | |
| 5,852,402 A | * | 12/1998 | Perry | 256/10 |

* cited by examiner

*Primary Examiner*—Hezron Williams
*Assistant Examiner*—Lilybett Martir
(74) *Attorney, Agent, or Firm*—Skadden, Arps, Slate Meagher & Flom LLP

(57) ABSTRACT

A taut wire sensor includes an actuator that is movably coupled to a housing. The actuator includes a taut wire terminal. The actuator has two contacts that are maintained in a spaced apart orientation by the mating of parts, which are held in place by a spring element. The actuator deforms when force is applied to the taut wire terminal of the sensor. When the actuator deform, an electrical connection is made between the two contacts to produce an alarm indication by the sensor. The orientation of the actuator is maintained by the mating of parts which are also held by a spring element. One of the contacts in the actuator is a flexible contact pin that is adapted to bend when high force is applied to the taut wire terminal. The sensor housing also includes a movement limiter that overcomes a weakness in prior sensors which employ compensating flowable materials to adjust sensor position.

16 Claims, 3 Drawing Sheets

TAUT WIRE SENSOR

FIELD OF THE INVENTION

The present invention relates to security sensors and more particularly to a taut wire sensor for a security post.

BACKGROUND

A variety of intrusion detection systems are known, ranging from those protecting private residences, to those protecting large-scale, relatively high security facilities such as airports and military installations. A large number of the systems of the second kind, those protecting large-scale facilities, typically provide a combination of a physical barrier and an electron detection capability. A taut wire intrusion detection system provides such a combination. Such systems are available, for example, from Safeguards Technology of Hackensack, N.J. The present invention provides a sensor to be used in such systems.

A typical taut wire intrusion detection system will include sensors, sensor posts, taut wires, anchor posts, and slider posts. A single or several sensors will usually be mounted on a single post, typically referred to as the "Sensor Post." Taut wires, commonly double strand steel barbed wire, are attached to the single sensor or to the group of sensors mounted on the Sensor Post. Each taut wire segment ("Taut Wire") usually terminates at two Anchor Posts placed on opposite sides of the Sensor Post to form a subsection of the intrusion detection system. Spiral shaped steel rods are sometimes placed vertically between the Taut Wires as to prevent the wires from bowing or sinking down, these elements are typically referred to as "Slider Posts." Each Taut Wire is maintained in tension between the anchor posts such that the sensor will detect a cut or deflection of the Taut Wire, triggering an alarm at a control center. Multiple subsections constructed in this manner are linked together to secure a given perimeter.

Taut Wire systems are widely used to protect military bases, correctional facilities, airports and many other sites requiring a higher degree of protection than that of a purely physical barrier. Examples of Taut Wire systems employing tension sensors are found in U.S. Pat. Nos. 4,367,459, 4,829,286, and 4,500,873.

SUMMARY OF THE INVENTION

In accordance with the invention there is provided a sensor for a taut wire fence, which has a plurality of generally parallel taut wires and a plurality of supporting posts with sensors mounted thereon. The sensor includes a housing, which has an internal cavity with an opening at a first longitudinal end, and which has a land portions around the opening. The housing also has seat portions inside the cavity. The sensor further includes an actuator, which has a taut wire terminal disposed on a first longitudinal end of the actuator, and which has a first electrical terminal and a second electrical terminal. The actuator is adapted to produce an electrical connection between the first electrical terminal and the second electrical terminal in response to skewing of the longitudinal axis of the actuator beyond a threshold angular displacement. The actuator also includes flange portions that extend substantially perpendicular from the outer surface of the actuator substantially near the skewing flexion point of the actuator. The actuator flange portions mate against the housing seat portions. Finally, the sensor includes a first spring element that is disposed between the actuator flange portions and the housing land portions to movably couple the actuator to the housing. In the sensor, the actuator second longitudinal end is within the housing cavity such that the housing cavity limits the movement range of the actuator second longitudinal end to produce a skewing of the actuator when the first longitudinal end is displaced beyond a threshold angle.

In one embodiment, the actuator of the sensor includes a cover, which has a bore having a closed end near a first longitudinal end of the bore and an open end near a second longitudinal end of the bore. The cover has flange portions extending substantially perpendicular from the outer surface of the cover substantially near the second longitudinal end of the bore. The cover also includes a coupling portion extending from the flange portions substantially parallel to the longitudinal axis of the bore, whereby the coupling portion includes inward facing seat portions substantially perpendicular to the longitudinal axis of the bore. The actuator further includes a base, which has a bore having a closed end and an open end, and which has flange portions extending substantially perpendicular from the outer surface of the base substantially near a first longitudinal end of the bore. The base flange portions mate against the cover flange portions. The base further includes an electrical contact disposed inside the bore on a second longitudinal end of the bore. The electrical contact is coupled to a first terminal of the actuator. The actuator also has a contact assembly rigidly coupled to the cover. The contact assembly has a contact wire, which extends out from the cover bore opening substantially along the bore opening longitudinal axis. The contact wire is electrically coupled to a second terminal of the actuator. Finally, the actuator includes a second spring element that is disposed between the base flange portions and the seat portions of the cover coupling portion to movably couple the cover to the base, whereby the contact wire of the contact assembly extends into the actuator base bore spaced apart from at least the electrical contact of the base such that the relative skewing of the cover with relation to the base produces an electrical connection between the electrical contact of the actuator base and the contact wire.

DETAILED DESCRIPTION

Figure 1:
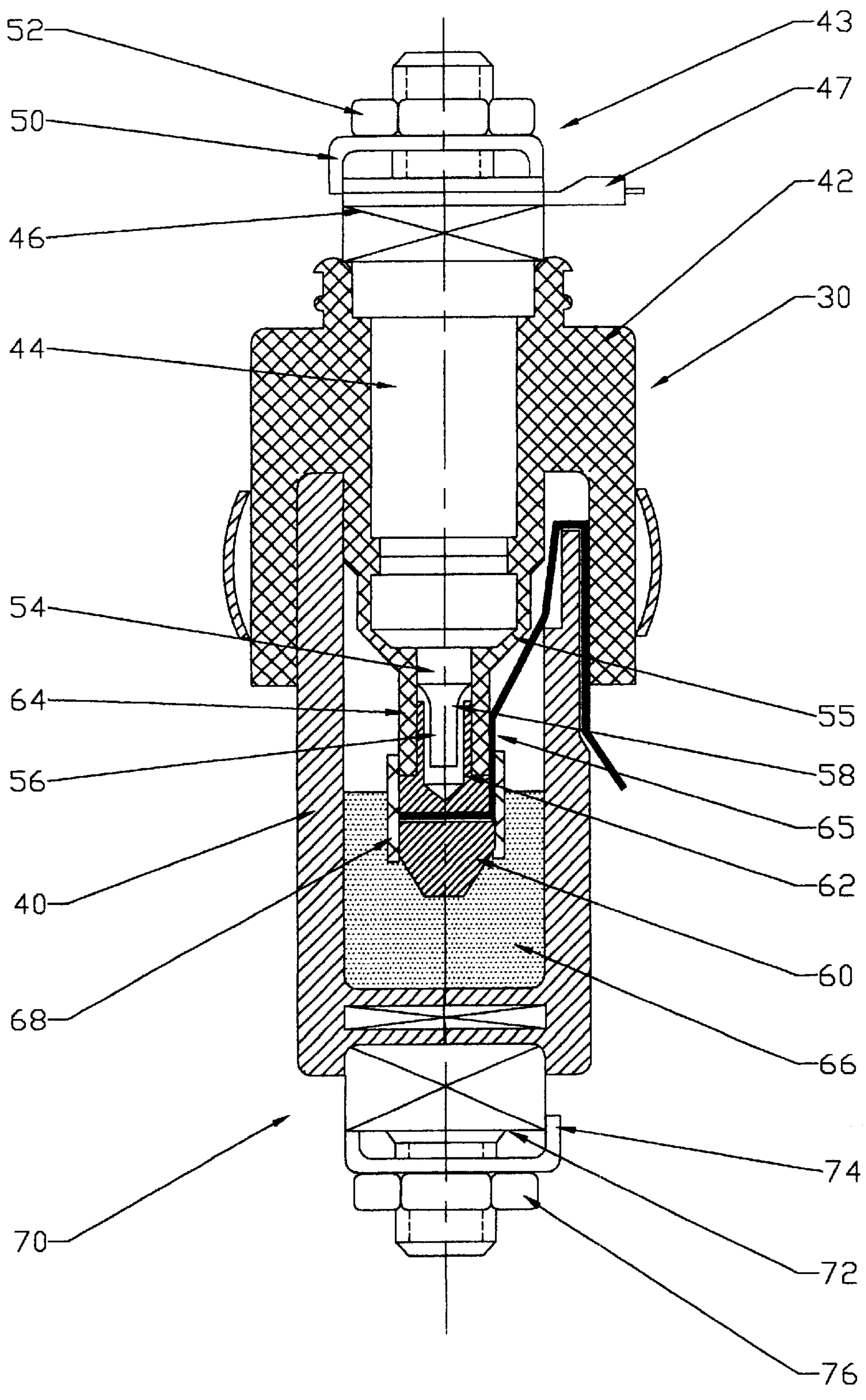
Figure 1 (Prior Art)
FIG. 1 illustrates a taut wire sensor of the prior art.

FIG. 1 illustrates a taut wire sensor of the prior art. The sensor 30 has a relatively rigid base 40. Mounted onto the base 40 is a flexible top sealing member 42, which is typically formed of EPDM or Neoprene rubber. A first taut wire connection terminal assembly 43 is sealingly mounted within the flexible top sealing member 42. The connection assembly 43 includes an elongated pin 44 which extends from the exterior of the top sealing member 42 to the interior of the base member 40. The outer part of the connection assembly 43 includes a clamp support base 46 that is integrally formed with the pin 44, an electrical conductor connector 47 that is coupled to a control apparatus (not shown) via conductors, a taut wire clamp 50, and a tightening nut 52 that engages a threaded top surface of the pin 44. The interior portion of the pin 44 defines a relatively narrow portion 54, which is generally surrounded by a cylindrical electrically insulative portion 55 of the top sealing member 42, and which terminates in a rigid electrical contact element 56, defining a cylindrical contact surface 58. A second electrical contact element 60, defining a cylindrical contact surface 62, is coupled to the contact element 56 by an electrically insulative cylindrically shaped joining member 64, and is further coupled to an electrical conductor 65. The joining member 64, which is typically formed of rubber and defines a continuation of the top sealing member 42 serves to maintain the two contact surfaces 58, 62, in a spaced, non-conducting relationship in the absence of external forces above a predetermined threshold. This predetermined threshold is typically selected such that deformation of the joining member 64 occurs and electrical contact is established between the contact elements 56, 60, producing an electrical circuit through the sensor, and signaling an alarm, when the respective longitudinal axes of the taut wire terminals are skewed with respect to each other.

The second electrical contact element 60 is mounted in a body of a flowable material 66 that is located within the base member 40 and which permits repositioning of the contact relative to the base portion under conditions of low stress, characteristic of temperature change induced movements, and which is rigid under conditions of high stress, such as produced by attempted penetration of the fence by an intruder. The flowable material is usually silicone putty such as General Electric G-E SS-91 Silicone Bouncing Putty. It may be appreciated that under temperature induced movements, the two contact elements 56, 60 tend to move together and thus retain their spaced relationship. When a sudden movement of one relative to the other occurs and the flowable material acts rigidly, deformation of the joining member 64 occurs and electrical contact is established across the two contact elements 56, 60. The temperature compensation has a side effect of allowing for the low force, low rate, movement of the taut wire without producing an alarm. Therefore, an intruder can exploit this effect to gain access through the taut wire fence by establishing a slow moving process to displace the taut wire terminal 43. Prior attempts to overcome this weakness in such sensors include attaching a movement limiter around the taut wire terminals 70, 43 to externally limit the sensor's range of movement so that the terminals cannot be displaced beyond a set level.

An insulative shield 68 is provided surrounding most of the contact element 60. A second taut wire connection terminal assembly 70 is rigidly mounted onto the base member 40 and comprises an integrally formed clamp base 72, a taut wire clamp 74, and a tightening nut 76. The terminal assembly 70 is generally electrically insulated from the two electrical contacts 56, 60.

In operation, the sealing top sending member 42 is substantially the only element of the sensor that maintains alignment of the longitudinal axis of the taut wire terminals 43, 70. Accordingly, when the top sealing member 42 deteriorates due to environmental factors and natural aging of the rubber, the sensor's operation deteriorates. This deterioration manifests itself in increased false alarm rate, uneven sensitivity between movement of the Taut Wire in opposite direction, and failure of the sensor due to constant connection between the electrical contacts 56, 60. Accordingly, there is a need for a sensor with greater reliability, accuracy, and longevity.

A second drawback in prior art sensors, such as the sensor of FIG. 1, is related to the electrical contacts 56, 60. When force is applied to the taut wire terminals, the pin's electrical contact element 56 is moved against the interior contact element 60. The contact elements 56, 60, are usually rigid metallic elements such as copper coated with gold. At times, the force applied to the taut wire terminals 43, 70, is high enough to cause the electrical contact 56 to bend when pressed against the interior contact element 60. The sensor 30 is then rendered unusable and has to be replaced. A bent electrical contact pin is usually characterized by a constant alarm indication from the sensor 30, which substantially hinders the operation of the sensor post, and sometimes the entire system.

Figure 2:
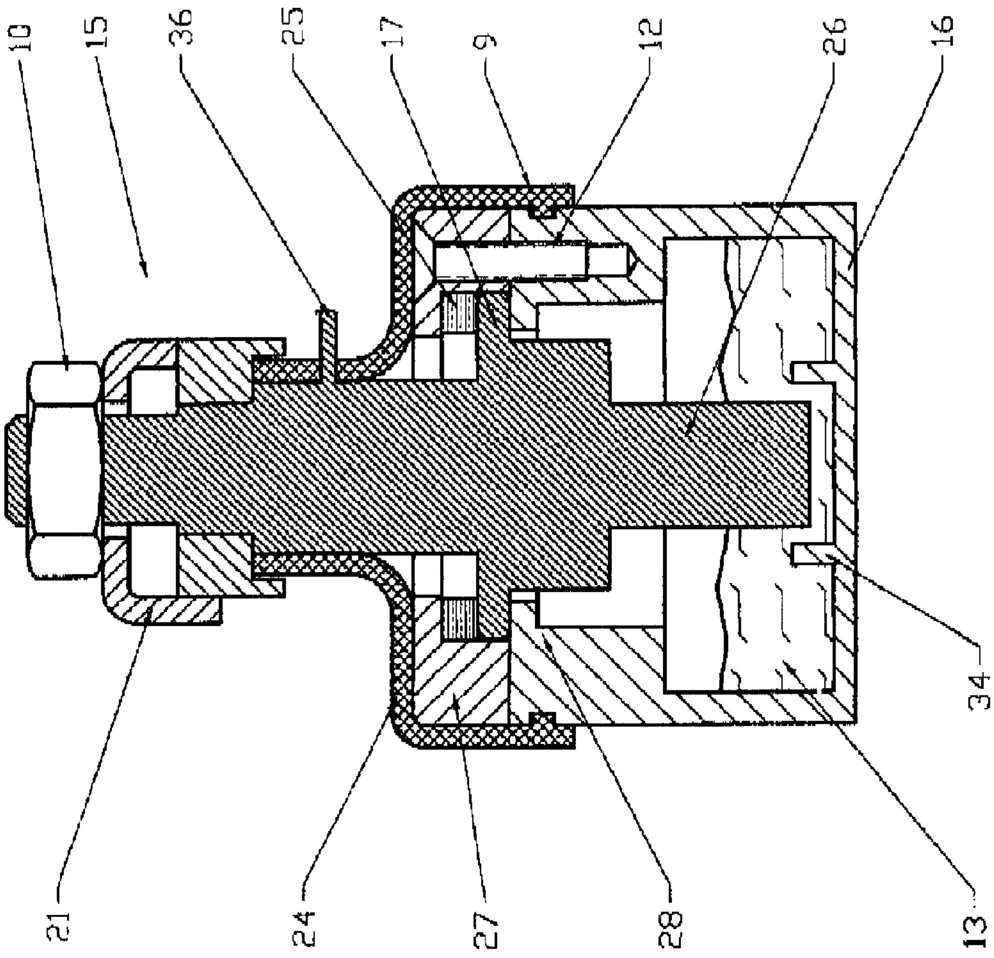
FIG. 2 illustrates a taut wire sensor in accordance with the invention.

FIG. 2 illustrates a sensor 10 in accordance with the invention, which overcomes the above disadvantages in prior art sensors. The sensor 10 includes a housing 16, a sleeve cover 9, and an actuator 26. The housing 16 has an internal cavity with a top opening. Land portions 27 are provided around the top opening of the housing 16. In one embodiment, the land portions 27 are not internally formed from the housing but are coupled to the housing 16 by bolts 12. Seat portions 28 are provided along the inner wall of the housing internal cavity. The seat portions 28 preferably extend perpendicular to the surface of the internal cavity. A movement limiter 34 is provided near the bottom of the internal cavity to limit the movement of the actuator 26. In one embodiment, the movement limiter 34 is a cylindrical member extending from the bottom of the internal cavity.

The actuator 26 has a taut wire terminal 15 at a first longitudinal end thereof. The taut wire terminal 15 is adapted to couple a Taut Wire to the sensor by way of the a taut wire clamp 21 and a tightening nut. In one embodiment, the taut wire terminal 15 is provided by a threaded bore and a slot opening in a cylindrical element that is coupled to the first longitudinal end of the actuator 26. A bolt engages the threaded bore to secure a taut wire inside the slot. The Taut Wire is preferably a tensioned Taut Wire as discussed above with reference to prior art systems.

In one embodiment, the actuator 26 includes flange portions 17 substantially around its circumference. The flange portions 17 are preferably located near the flexion point of the actuator 26, about which it deflects in response to movement of the taut wire terminal 15.

In one embodiment, the actuator 26 is movably coupled to the housing 16 by a spring element 25 that is compressly mounted between the actuator flange portions 17 and the housing land portions 27. The actuator flange portions 17 are positioned in contact with the housing seat portions 28. Accordingly, the spring element 25 compressly maintains the actuator flange portions 17 inside a bracket-shaped portion of the housing 16, which is provided by the housing wall, land portions 27, and seat portions 28. In this manner, the compression force of the spring element 25, along with the surface orientation of the flange 17 and the seat portions 28, maintains the actuator 26 in an orientation substantially along the longitudinal axis of the housing 16.

In the illustrated embodiment, the spring element 25 is provided by a pair of stainless steel spring wave washers. Such springs are available from Smalley Steel Ring Company of Wheeling Ill. As may be appreciated, in other embodiments, the springs element 25 is provided by a single helical spring or more than two diametrically spaced springs. In yet another embodiment, the spring element 25 is made from a flexible compressive material such as elastomeric rubber.

The housing 16 and actuator 26 are preferably enclosed by a water repelling rubber sleeve 24 to prevent water from entering the housing or the actuator. In one embodiment, the housing 16 includes a mounting assembly (not shown) that is adapted to facilitate mounting the sensor to a Sensor Post. In this embodiment, the sensor 10 is rigidly coupled to a Sensor Post. In another embodiment, where the sensor has a taut wire terminal on the exterior of the housing 16, the sensor is pivotally mounted to a sensor post so that it can pivot in the plane defined by the pair of taut wires it is coupled to, similar to the prior art sensor of FIG. 1.

The housing cavity preferably contains flowable material 13 such as the silicone putty of the prior art sensor of FIG. 1. The flowable material 13 allows the actuator 26 to move within the housing cavity without deforming, such as when the taut wire terminal 15 is subject to low force application due to snow, wind, or earth movement. The flowable material provides a resistive force against the actuator base 23 when the actuator assembly movement is beyond a threshold force and speed, thereby causing the actuator 26 to deform.

In operation, when the actuator 26 moves, the maximum angular displacement of the actuator base 23, which is within the flowable material, is limited by the location of the limiter 34. Thus, the actuator 26 deforms after contacting an edge of the limiter 34. Therefore, there is no need to include the external movement limiters of the prior art. As may be appreciated, the location of the limiter 34 within the housing 16 can be adjusted to set the maximum angular displacement for the actuator base 23.

Figure 3:
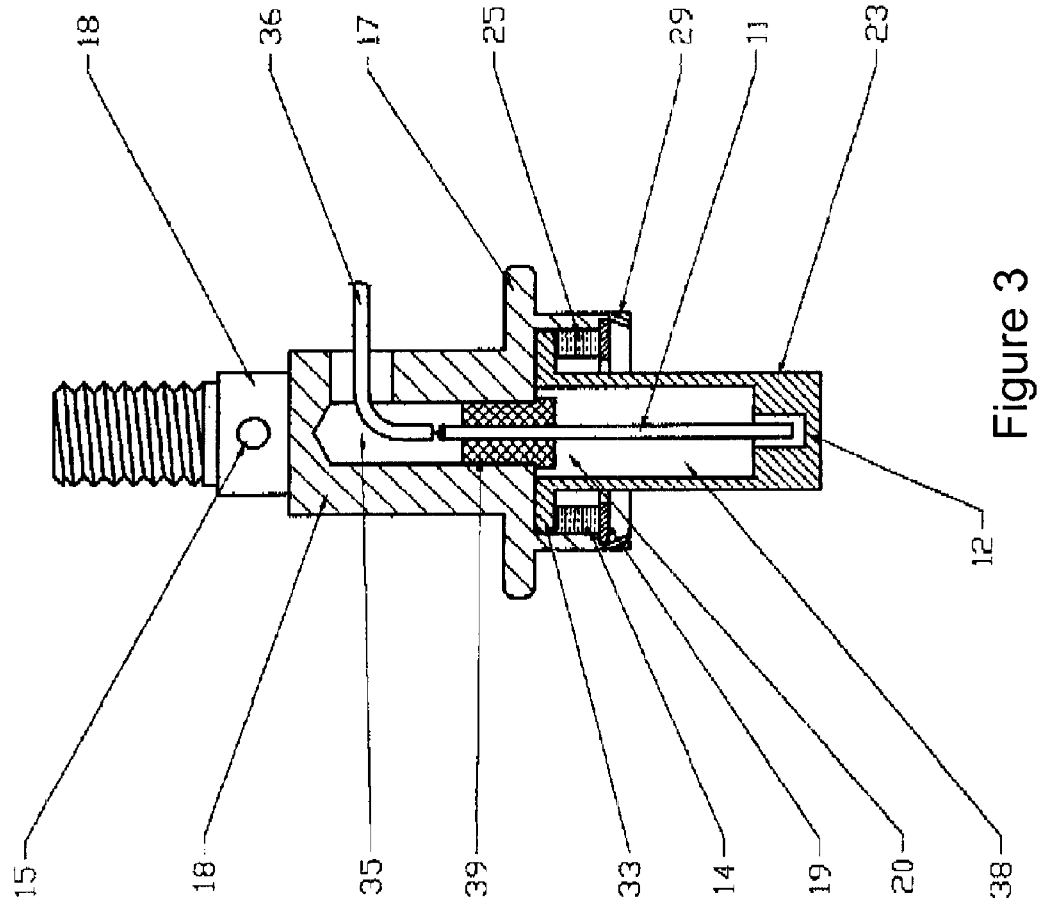
FIG. 3 illustrates the actuator assembly of the taut wire sensor of FIG. 2.

FIG. 3 illustrates the actuator 26 of the sensor 10 of FIG. 1. The actuator 26 has an actuator cover 18 and an actuator base 23. The actuator cover 18 includes a bore opening 35 having a closed end and an open end. Flange portions 17 are provided around the open end of the bore opening 35. The actuator cover 18 also includes a cylindrical coupling portion 29, which extends perpendicular to, and downward from, the flange portions 17. An opening is preferably provided in the actuator cover 18, near the bore opening 35 closed end, to allow an insulated electrical wire 36 to pass and electrically couple a contact assembly 20 (discussed below) to a terminal of the sensor 10.

The actuator base 23 has a bore opening 38 with a closed end and an open end. Flange portions 33 are provide around the open end of the actuator base bore opening 38. A contact cup 12 is provided around the closed end of the bore opening 38. The contact cup 12 is preferably made from a conductive material and is electrically coupled to a first terminal of the sensor 10. In one embodiment, the contact cup 12 is gold plated and is pressed into the actuator base 23. The contact cup 12 is coupled to a first terminal of the sensor 10, which is electrically coupled to the housing. Because the housing is conductive, the contact cup 12 is operatively coupled to this terminal. In another embodiment, an insulated wire is coupled to the contact cup and is passed outside the housing by an appropriate opening to connect to the first terminal similar t the conact cup connection in the prior art sensor of FIG. 1.

A contact assembly 20 is fixedly mounted in the open end of the actuator cover bore opening 35. The contact assembly 20 includes a contact pin 11, an insulating bushing 39, and the electrical wire 36. The contact pin 11 preferably extends out from the open end of the bore opening 35. In one embodiment, the contact pin 11 is preferably fitted through a center bore in the bushing 39. The contact pin 11 is preferably a resilient conductive member. In this embodiment, the contact pin 11 is a gold-plated beryllium copper spring wire. Such spring wire is available from Knight Precision Wire of Herts, England. In another embodiment, the contact pin 11 is made from other non-ferrite material to prevent corrosion. The electrical wire 36 of the contact assembly 20 is preferably coupled to a second terminal of the sensor 10.

The actuator base 23 is coupled to the actuator cover 18 by placing the open end of the actuator base against the open end of the actuator cover, to provide an internal actuator cavity. The longitudinal axis of the actuator cover 18 and of the actuator base 23 are thereby aligned to provide the longitudinal axis of the actuator 26. The contact assembly 20 extends into the actuator base bore opening 38. The contact pin 11 of the contact assembly 20 extends into, and spaced apart from, the walls of the bore opening 38 of the actuator base 23. The contact pin 11 includes a conductive portion that is positioned inside the contact cup 12 in a spaced apart orientation, when no force is applied to the sensor 10.

The actuator base flange portions 33 rest against the bottom of the actuator cover flange portions 17, within the opening defined by the actuator cover coupling portions 29. A second spring element 14 is compressly provided between the coupling portions 29 and the actuator base flange portions 33. In one embodiment, washers 19 are used to support the spring element 14 in position between the flange portions 33 and the coupling portions 29. In this embodiment, the coupling portions 29 are deformed and bent inward to retain the washers 19 in place. The second spring element 14 is preferably also from Smally Spring Co. Accordingly, the second spring element 14 and the actuator base flange portions 33 are secured within a bracket-shaped element of the actuator cover 18, provided by the actuator flange portions 17 and the coupling portions 29. The second spring element's compressive resistance facilitates maintaining longitudinal axis alignment between the respective longitudinal axis of the actuator cover 18 and of the actuator base 23. In one embodiment, the actuator base 23 and actuator cover 18 are made from stainless steel. In another embodiment, the actuator base 23 is plated brass.

In operation, the sensor 10 is fixedly mounted within a sensor post by a clamp that couples to the sensor body. The Taut Wire is attached to the sensor is taut wire terminal 15. When force is applied to the taut wire terminal 15, the longitudinal axis of the actuator 26 is skewed, moving the contact pin 11 towards the conductive inner surface of the contact cup 12. If the skewing of the actuator 26 is beyond an angular threshold, an electrical connection is formed between the contact pin 11 and the contact cup 12. The electrical connection between the contact pin 11 and the contact cup 12 facilitates an electrical connection between the corresponding first and second terminals of the sensor 10. The connection between the sensor terminals is detected at a monitoring station (not shown) to identify an alarm condition. In the absence of an application of force to the taut wire terminal 15, the first and second spring elements 25, 14, maintain the alignment of the respective longitudinal axis, thereby providing the contact pin 11 spaced from the conductive surface of the contact cup 12.

The movement of the actuator 26 is restricted by the movement limiter 34 such that the actuator base 23 engages the limiter after some threshold movement. If the actuator 26 is moved further, the movement is translated as skewing of the actuator because the base 23 is stationary. The skewing produces a connection between the sensor's terminals to indicate an alarm. Thus, the sensor is not dependent on the reactive properties of the compensating fluid 13, which can change with temperature. The compensating fluid is introduced to add deflection speed as a factor to consider in generating an alarm. Environmental factors, such as temperature changes from day to night, earth movement, ruin, and wind, can cause the actuator to lose its alignment with the sensor housing. Therefore, the compensating fluid 13 is used to negate these effects by allowing for the small shift in position while maintaining the actuator base 23 aligned with the actuator cover 18.

Unlike prior art sensors, the contact pin 11 of the sensor 10, does not permanently deform when high force is applied to the taut wire terminal 15. Rather, the contact pin 11 returns to a neutral position in a spaced apart orientation from the contact cup 12. Accordingly, the sensor of the present invention is less likely to fail and require replacement than prior art sensors with rigid contact elements.

As may be appreciated, the sensor of the present invention provides more accurate operation than prior art sensors. The spring element arrangement of the invention provides that the sensor is set to a neutral position by the compressive force of spring elements in combination with the mating of the various parts, as opposed to the previous sensor where the neutral position depends on the resilient properties of a rubber cover. The spring elements are preferably metal extruded springs, which have a high compressive force consistency over time and varying conditions, as compared to the resilience of rubber. The force consistency provides for a high degree of accuracy in threshold force requirement and symmetrical distribution of such force. The spring element design also provides for better resistance to extreme temperatures and humidity, which adversely affect the rubber housing of prior art sensors.

The sensitivity of the sensor of the invention can be adjusted by moving the taut wire terminal 15 up or down along the actuator 26. By moving the taut wire terminal 15, the distance from the pivot point of the sensor is changed. As is known, increasing the distance of the contact point from the pivot point results in less displacement at the contact point to provide an equal displacement at the opposite end of the sensor (contact pin end). As may be appreciated, in the same manner, the sensor sensitivity can be modified by changing the length of the pin 11.

Although the present invention was discussed in terms of certain preferred embodiments, the invention is not limited to such embodiments. Rather, the invention includes other embodiments including those apparent to a person of ordinary skill in the art. Thus, the scope of the invention should not be limited by the preceding description but should be ascertained by reference to the claims that follow.

What is claimed is:

1. A sensor for a taut wire fence comprising a plurality of generally parallel taut wires and a plurality of supporting posts with sensors mounted thereon, the sensor comprising:

a housing, the housing including an internal cavity with an opening at a first longitudinal end, the housing including land portions around the opening, the housing including seat portions inside the cavity;

an actuator, the actuator including a taut wire terminal disposed on a first longitudinal end of the actuator, the actuator having a first electrical terminal and a second electrical terminal, the actuator adapted to produce an electrical connection between the first electrical terminal and the second electrical terminal in response to skewing of the longitudinal axis of the actuator beyond a threshold angular displacement, the actuator including flange portions extending substantially perpendicular from the outer surface of the actuator, the actuator flange portions mate against the housing seat portions;

a first spring element disposed between the actuator flange portions and the housing land portions to movably couple the actuator to the housing, the actuator second longitudinal end is within the housing cavity such that the housing limits the movement range of the actuator second longitudinal end to produce a skewing of the actuator when the first longitudinal end is displaced beyond a threshold angle.

2. The sensor of claim 1, wherein the housing further includes a compensating fluid in housing the cavity to provide dampening force against the actuator second longitudinal end.

3. The sensor of claim 2, wherein the compensating fluid is silicone putty.

4. The sensor of claim 1, wherein the housing further includes movement limiters disposed around the bottom of the housing cavity to limit the movement range of the actuator second longitudinal end.

5. The sensor of claim 1, wherein the first spring element comprises at least two circumferentially equally spaced spring wave washers.

6. The sensor of claim 1, further including a water resistant cover.

7. The sensor of claim 1, wherein the housing has a second taut wire terminal at a second longitudinal end of the sensor.

8. The sensor of claim 1, wherein the actuator comprises:

a cover, the cover including a closed end at a first longitudinal end and an open end at a second longitudinal end, the open end including a bore, the closed end adapted to couple to a taut wire, the cover including flange portions extending substantially perpendicular from the outer surface of the cover substantially near the second longitudinal end, the cover including a coupling portion extending from the flange portions substantially parallel to the longitudinal axis of the cover, the coupling portion including seat portions substantially perpendicular to the longitudinal axis of the cover;

a base, the base including a closed end at a first longitudinal end and an open end at a second longitudinal end, the open end including a bore, the base including flange portions extending substantially perpendicular from the outer surface of the base substantially near a first longitudinal end of the base, the base flange portions mate against the cover flange portions, the base further including an electrical contact disposed inside the bore near the second longitudinal end of the base, the electrical contact coupled to a first terminal of the actuator;

a contact assembly rigidly coupled to the cover, the contact assembly including a contact wire, the contact wire extending out from the cover bore opening substantially along the longitudinal axis of the cover, the contact wire electrically coupled to a second terminal of the actuator; and a second spring element disposed between the base flange portions and the seat portions of the cover coupling portion to movably couple the cover to the base, the contact wire of the contact assembly extending into the actuator base bore spaced apart from at least the electrical contact of the base whereby the relative skewing of the cover with relation to the base produces an electrical connection between the electrical contact of the actuator base and the contact wire.

9. The sensor of claim 8, wherein the cover flange portions extend perpendicular from the open end of the cover bore.

10. The sensor of claim 8, wherein the base flange portions extend perpendicular from the open end of the base bore.

11. The sensor of claim 8, wherein the contact wire is a flexible wire.

12. The sensor of claim 11, wherein the flexible wire is a beryllium copper spring wire.

13. The sensor of claim 8, wherein the second spring element comprises a single spring.

14. The sensor of claim 8, wherein the second spring element comprises at least two circumferentially equally spaced springs.

15. A sensor for a taut wire security system, comprising:

an actuator, the actuator having a taut wire terminal at a first end thereof, the actuator adapted to produce an alarm condition in response to skewing of the longitudinal axis between the first end thereof and the second end thereof, the actuator including coupling means;

a housing, the housing means including a cavity adapted to receive the second end of the actuator thereto, the housing including coupling means inside the cavity, the housing including a movement limiting element within the cavity to limit the movement range of the second end of the actuator; and spring means, the spring means moveably coupling the coupling means of the actuator to the coupling means of the housing to maintain the alignment of the first end and the second end of the actuator when force is not applied to the actuator beyond a predetermined threshold.

16. The sensor of claim 15, wherein the actuator comprises:

cover means, the cover means retaining a first contact means of the actuator, the first contact means electrically coupled to a first terminal of the actuator, the first contact means extending from the cover means along the longitudinal axis of the cover means, the cover means including coupling means;

base means, the base means retaining a second contact means of the actuator, the second contact means disposed within the base means, the base means including coupling means;

spring means to movably couple the coupling means of the cover means to the coupling means of the base means, the coupling of the base means to the cover means provides the first contact means within a cavity defined by the second contact means and spaced apart from the second contact means.

* * * * *

UNITED STATES PATENT AND TRADEMARK OFFICE
Certificate

Patent No. 6,578,438 B2

Patented: June 17, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Emanuel Steinberg, Tel Aviv, Israel.

Signed and Sealed this Twenty-third Day of August 2005.

EDWARD LEFKOWITZ
*Supervisory Patent Examiner*
Art Unit 2855